United States Patent [19]

Baliga

[11] Patent Number: 4,618,872
[45] Date of Patent: Oct. 21, 1986

[54] INTEGRATED POWER SWITCHING SEMICONDUCTOR DEVICES INCLUDING IGT AND MOSFET STRUCTURES

[75] Inventor: Bantval J. Baliga, Schenectady, N.Y.

[73] Assignee: General Electric Company, Schenectady, N.Y.

[21] Appl. No.: 558,403

[22] Filed: Dec. 5, 1983

[51] Int. Cl.[4] ............ H01L 29/78; H01L 29/74; H03K 17/687
[52] U.S. Cl. ............... 357/23.4; 357/23.14; 357/38; 307/577; 307/581; 307/584
[58] Field of Search ............. 357/23 VD, 23 MG, 38, 357/38 T; 307/577, 581, 584

[56] References Cited

U.S. PATENT DOCUMENTS

| | | | |
|---|---|---|---|
| 4,072,975 | 2/1978 | Ishitani | 357/23 |
| 4,145,703 | 3/1979 | Blanchard et al. | 357/55 |
| 4,260,908 | 4/1981 | Mings et al. | 307/584 |
| 4,364,073 | 12/1982 | Becke et al. | 357/38 |
| 4,402,003 | 8/1983 | Blanchard | 357/23.4 |
| 4,417,385 | 11/1983 | Temple | 357/23.4 |

OTHER PUBLICATIONS

Nathan Zommer, "The Monolithic HV BIPMOS", *IDEM* 1981, pp. 263–266.

Leipold et al, International Electron Devices meeting, Washington, DC, Dec. 1980, vol. 4.3, pp. 79–82.

*Primary Examiner*—Andrew J. James
*Assistant Examiner*—R. Limanek
*Attorney, Agent, or Firm*—John R. Rafter; James C. Davis, Jr.; Marvin Snyder

[57] ABSTRACT

Hybrid power switching semiconductor devices advantageously integrate IGT and MOSFET structures. The IGT and MOSFET portions of the overall device include respective gate structures each having an associated gate electrode capacitance, and the hybrid device includes a resistance element connecting the IGT and MOSFET gates. The gate structures preferably comprise polysilicon electrodes, and the resistance element comprises a polysilicon bridge formed at the same time during device fabrication. The overall device has only a single gate terminal, which is connected relatively directly to one of the IGT and MOSFET gates, and indirectly through the resistance element to the other of the IGT and MOSFET gates such that an RC time delay network is defined. Two different types of power switching functions are achieved depending upon whether the overall device gate terminal is connected nearer the IGT gate or the MOSFET gate.

6 Claims, 6 Drawing Figures

INTEGRATED POWER SWITCHING SEMICONDUCTOR DEVICES INCLUDING IGT AND MOSFET STRUCTURES

BACKGROUND OF THE INVENTION

The present invention relates to hybrid power switching semiconductor devices which advantageously integrate an insulated-gate transistor (IGT), sometimes referred to in the past as an insulated-gate rectifier (IGR), and a power metal-oxide-semiconductor field-effect transistor (MOSFET). (A MOSFET may more generically be termed an insulated-gate field-effect transistor (IGFET), and the two terms, MOSFET and IGFET, are employed interchangeably herein.)

Various types of three-terminal power switching semiconductor devices are known. The various device types in many cases have different operating characteristics and are suitable for various different specific circuit applications. In efforts to advantageously combine their differing characteristics, circuits have ben proposed which include two discrete devices of different types, typically connected in parallel. As a convenient embodiment of such circuits, hybrid devices which integrate two difference device structures on a single semiconductor chip have also been proposed.

By way of pertinent example, an integrated MOSFET and bipolar junction transistor (BJT) switching device is disclosed in the following literature reference: N. Zommer, "The Monolithic HV BIPOS", paper number 11.5, IEDM 1981, pages 263–266. The device described by Zommer achieves in a single structure the relatively lower conduction losses of the bipolar junction transistor and the relatively higher speed and lower energy drive characteristics of a MOSFET. However, the integrated MOSFET and bipolar junction transistor device described by Zommer requires two different, yet synchronized, gate signals for the two parts of the device. Specifically, the MOSFET requires a voltage drive source for its gate and the bipolar junction transistor requires a current drive source for its base. Thus, the device is actually a four-terminal switching device requiring specialized gate drive signals. Additionally, different processing steps are typically employed for MOSFETs and bipolar junction transistors, so that fabricating a bipolar junction transistor and a MOSFET on the same chip is more difficult than fabricating either device alone.

To aid in understanding the present invention, it is helpful to review the structures and characteristics of power MOSFETs and IGTs, both of which are three-terminal semiconductor devices. MOSFETs are capable of relatively high-speed switching, but exhibit relatively low conductivity. IGTs exhibit relatively high conductivity (in the order of five times greater than bipolar junction transistor and twenty times greater than power MOSFETs), fast turn-on and the ability to withstand high time rate of change of current (di/dt) during turn-on, but relatively slow turn-off switching speed which restricts maximum operating frequency and can result in "current tailing", a condition in which the device is momentarily subjected to high current and high voltage simultaneously, with attendant high device power dissipation.

A typical N-channel power MOSFET includes an N+ (or highly-doped N conductivity type) source region and an N− (or high resistivity N conductivity type) drift or drain region separated from each other by a P base region having a channel surface. An insulated-gate electrode, typically formed of polysilicon, is disposed over the channel surface. In operation, application of a sufficiently large positive gate electrode bias (with reference to the source region) results in formation of an N conductivity type inversion layer in the P base region just below the channel surface. The inversion layer thus comprises an induced channel allowing conduction of electrical current between the source and drain. Examples of such devices are disclosed in Ishitani U.S. Pat. No. 4,072,975, and in Blanchard U.S. Pat. No. 4,145,703, to which reference may be had for further details.

MOSFETs are primarily unipolar conduction devices wherein primarily majority carrier (e.g. electron) current flows between source and drain. Excess charge carriers (electrons and holes) do not accumulate in the N drift region, permitting relatively rapid device turn-off. Thus, power MOSFETs are capable of relatively high switching speeds, in excess of 100 Mhz. Because current flow is limited by the majority carrier (electron) concentration in the N conductivity type induced channel and N conductivity type drift regions, the power MOSFET exhibits relatively high on-resistance. In MOSFETs designed for operation at greater than 100 volts, the resistance of the drift region becomes large because the majority carrier concentration in the drift region must be small and the drift region width must be large in order to support the device blocking voltages.

An IGT employs an insulated gate for controlling current flow between its main terminals, i.e., between its collector and emitter terminals. The gate and conduction channel of an IGT are structurally similar to corresponding elements of a MOSFET. Various forms of IGT devices are disclosed in commonly-assigned U.S. patent application Ser. No. 483,009, filed Apr. 7, 1983, a continuation of application Ser. No. 212,181, filed Dec. 2, 1980, by B. J. Baliga entitled "GATE ENHANCED RECTIFIER". (It may be noted that a "Gate Enchanced Rectifier", or "GERECT", is alternatively referred to herein as an "insulated-gate transistor", or "IGT". The two terms "GERECT" and "IGT" are intended to mean the same device.).

Previously-disclosed IGTs differ from vertical channel MOSFETs in that, in an N-channel IGT, a P+ collector region, not found in an N-channel MOSFET, is included, resulting in a four-layer, i.e., PNPN, device. Moreover, an IGT has relatively high di/dt capability, and much higher conductivity than a MOSFET. During forward conduction the P+ collector region of an IGT injects minority carriers (e.g. holes) into the N conductivity type base region corresponding to the drift region of a MOSFET. In the IGT, however, holes introduced into the N− base region from the IGT collector region recombine with electrons introduced from the IGT emitter, increasing device conductivity compared to a MOSFET.

The IGT does not turn off in an ideal manner when gate drive is removed, since excess majority carriers, e.g. electrons, tend to become trapped in the N-base region, so that the IGT continues conducting until the excess electrons are removed. Thus, while the IGT is turning off, high voltage and high current may occur simultaneously, resulting in high power dissipation in the device. While there are measures which may be taken to accelerate device turn-off and thus reduce turn-off power dissipation, in an IGT, such as providing emitter-to-base electrical shorts or by introducing recombination centers in the N base region to trap excess electrons, the present invention is concerned with alternative ways of avoiding high power dissipation during the IGT turn-off.

SUMMARY OF THE INVENTION

Accordingly, it is a primary object of the invention to provide combination semiconductor switching devices which have only three-terminals, including a single high input impedance gate drive terminal.

It is another object of the invention to provide a power switching semiconductor device having low steady state losses and low switching losses when operated at relatively low switching frequencies, and which is capable of relatively high speed switching.

It is yet another object of the invention to provide integrated power switching semiconductor devices including two different semiconductor device structures which may readily be fabricated simultaneously.

In accordance with one particular aspect of the invention, a power switching semiconductor device comprises an IGT structure and a MOSFET structure (or, more generically, an IGFET structure) integrated within a single semiconductor device. The IGT and MOSFET portions of the overall device include respective gate structures, and the hybrid device includes a resistance element connected between the IGT and the MOSFET gates. Only a single device gate terminal is provided, near either the IGT or MOSFET gate. Electrical connection is made to the other gate terminal indirectly through the resistance element.

In accordance with the invention, two different types of power switching functions are achieved depending upon whether the device gate terminal is connected nearer the IGT gate or MOSFET gate. In either event, only one gating signal need be provided, and characteristics of the two devices are advantageously combined.

Preferably, polysilicon gate electrode structures are employed, the fabrication technology for which is well developed in the context of power MOSFETs. The insulated polysilicon gate electrode structure for the IGT and the insulated polysilicon gate electrode structure for the MOSFET are fabricated simultaneously and are coplanar. The resistance element comprises in a preferred form a bridge of polysilicon joining the two polysilicon insulated-gate electrode structures, fabricated at the same time as the gate electrode structures.

In a first particular embodiment, the device gate electrode connection is made most directly to the IGT gate, and electrode connection to the MOSFET gate is made indirectly through the resistance element. The resultant device has relatively low steady state and switching losses. An exemplary use is in motor drive circuits, which typically operate at relatively low switching frequencies, i.e., not exceeding 20 kHz. In particular, when a gating signal occurs, the IGT begins conducting first, and the relatively high di/dt and rapid turn-on capabilities of the IGT are utilized. Thus, the turn-on switching losses are relatively low. Due to the resistance element in series with the MOSFET, combined with the MOSFET gate electrode capacitance, the MOSFET turns on after the IGT. Once the overall device is on, steady state loss is low due to the superior forward current conductivity of the IGT.

When the gating signal is removed, the IGT again is the first device to switch, and thus turns off first. However, during the "current tailing" of the IGT, the IGFET portion of the device remains on, keeping the voltage across the overall device low to minimize device power dissipation. Thereafter, the overall device is not subjected simultaneously to high voltage and high current, and the IGFET turns off with minimal switching losses.

In a second particular embodiment, the device gate terminal is connected most directly to the MOSFET gate electrode, with electrical connection being made to the IGT gate electrode only indirectly through the resistance element. This configuration results in low power losses during low frequency switching, while maintaining high speed switching capability. For example, in one particular circuit for operating a gaseous discharge lamp, the lamp is initially started with a switching frequency of 120 Hz. Thereafter, when the lamp begins steady-state operation, an arc mode is initiated in which 100 kHz switching occurs.

In this second particular embodiment, at low operating frequencies there is sufficient time to charge the gate capacitance of the IGT during each cycle and thus to gate the IGT into conduction during each cycle even through the series gate resistance. Although the MOSFET conducts first, the low conduction loss of the IGT keeps the overall power losses low. At higher frequencies, switching is accomplished solely by the MOSFET, leaving the IGT with insufficient time to begin conducting due to the RC time delay introduced by the resistance element and the IGT gate capacitance. Thus, high speed MOSFET switching proceeds without interference from the IGT.

These two particular embodiments are quite similar in overall structure, differing only in placement of the gate contact. In either embodiment, the device comprises a pair of device main terminals. The IGT structure further includes collector and emitter terminal regions connected to the device main terminals. The IGT gate controls conduction between the collector and emitter terminal regions. The IGFET structure further includes drain and source terminal regions also connected to the device main terminals. The IGFET gate controls conduction between the drain source terminal regions.

For providing both IGT and IGFET structures within the same semiconductor body and within the same active device area, the techniques disclosed in commonly-assigned U.S. patent application Ser. No. 464,161, filed Feb. 4, 1983 by B. J. Baliga and entitled "HYBRID POWER SWITCHING SEMICONDUCTOR DEVICES INCLUDING SCR STRUCTURES" may be employed. In one specific technique described and claimed therein, an N+ conductivity type buried layer is included in the IGFET portion of the device only, and serves to avoid bipolar action and thus maintain IGFET characteristics.

In the present invention, an integrated power switching semiconductor device comprises a body of semiconductor material including both an IGT portion and an IGFET portion. The body has first and second (e.g. lower and upper) opposed principal surfaces on opposite sides. The body includes a first base layer of one conductivity type, for example, an N— base (lightly-doped to N conductivity type), common to both the IGT portion and the IGFET portion. The body also includes a first main terminal region, common to both the IGT and IGFET portions, extending to the device first principal surface where it contacts collector electrode metallization.

At least a portion of the first main terminal region is heavily doped to the opposite conductivity type to serve as a P+ IGT collector and defines a PN junction with the N− first base layer within the IGT portion. The first base layer and the first main terminal region also include a structure for avoiding bipolar conduction within the IGFET portion. Preferably, the entire first main terminal region is of P+ conductivity type, and for avoiding bipolar conduction within the IGFET portion there is a buried layer heavily doped to the one conductivity type, e.g., an N+ region, between the first base layer and the first main terminal region. This N+ buried layer is included only in the IGFET portion of the device.

Also included in the semiconductor body is a second base region of the opposite conductivity type, e.g. a P region, having at least two portions contiguous with the first base layer. One portion of the P base region is included in the IGT portion of the device, and another portion of the P base region is included in the IGFET portion of the device.

The body also includes in a second main terminal region first and second portions of the one conductivity type, e.g., an IGT N+ emitter region and an IGFET N+ source region. The IGT N+ emitter region is included in the device IGT portion contiguous with the one portion of the second base region, and the IGFET N+ source region is included in the device IGFET portion contiguous with the other portion of the second base region.

For supporting device conduction, there are IGT and IGFET channel portions. More specifically, the IGT channel portion is included within the IGT portion of the second base region and extends into the second base region from the surface of the body. The N+ IGT emitter region and the N− first base layer are spaced to define the extent of the IGT channel portion therebetween.

In similar fashion, the IGFET channel portion is included in the IGFET portion of the second base region and extends into the second base region from the surface of the body. The IGFET N− source region and the N− first base layer are spaced to define the extent of the second channel portion therebetween.

IGT and IGFET insulated-gate electrodes, such as of polysilicon, are respectively disposed over the IGT and IGFET channel portions so that, when the gate voltage is applied to the gate electrodes, conduction channels of the one conductivity type, extending between the IGT emitter and IGFET source portions of the second main terminal region and respective portions of the N− first base layer, are induced in the respective channel portions.

Finally, a resistance element comprising a bridge of polysilicon joining the two polysilicon gate electrodes is formed, preferably at the same time as the gate electrodes. A device gate terminal is connected relatively directly to one of the polysilicon gate electrodes, and indirectly through the resistance element to the other polysilicon gate electrode.

BRIEF DESCRIPTION OF THE DRAWINGS

While the novel features of the invention are set forth with particularity in the appended claims, the invention both as to organization and content, will be better understood and appreciated from the following detailed description taken in conjunction with the drawings, in which:

DETAILED DESCRIPTION OF THE PREFERRED EMBODIMENTS

Figure 1:
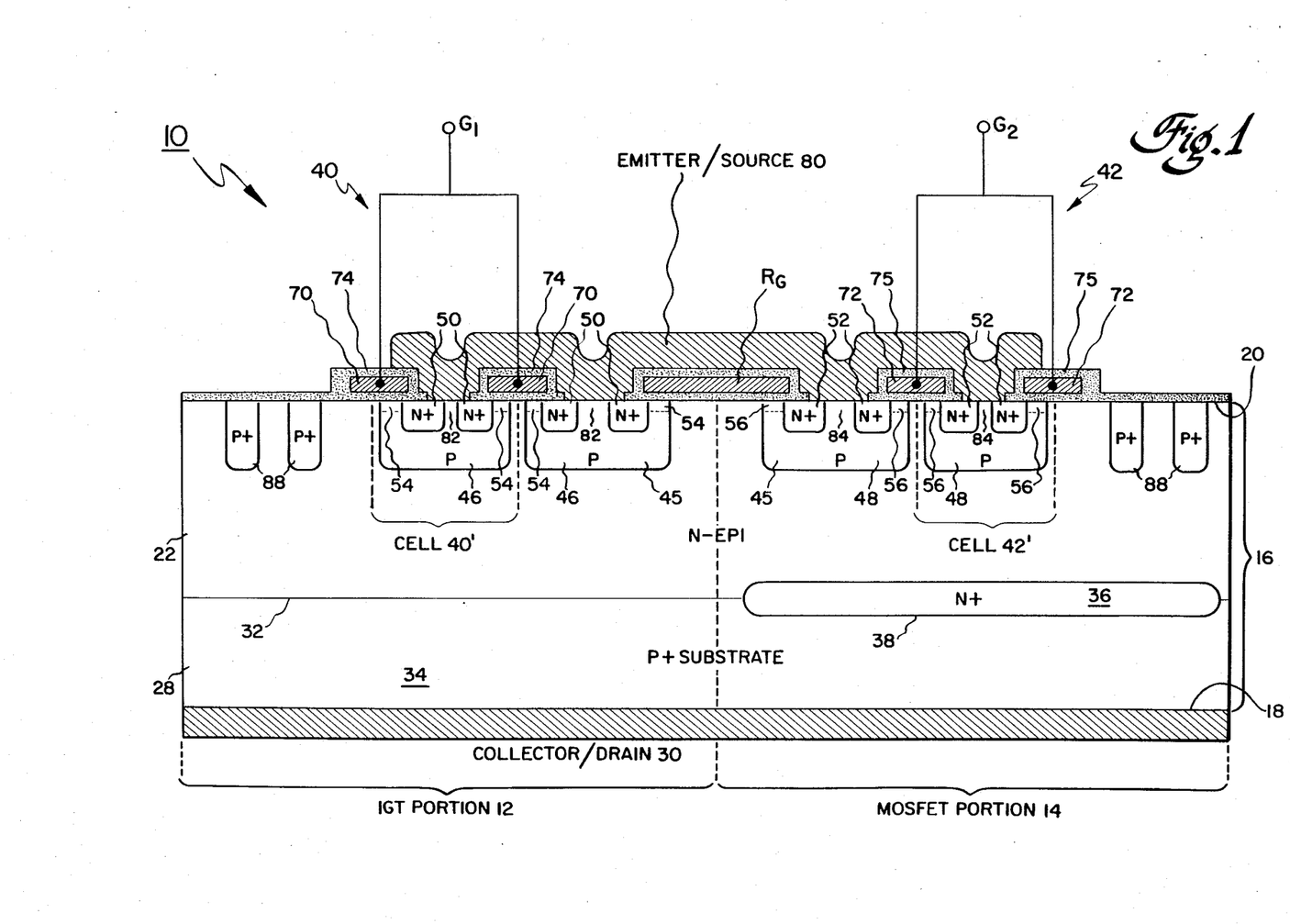
FIG. 1 is a sectional side view of an integrated power switching semiconductor device in accordance with the invention.

Referring first to FIG. 1, an integrated power switching semiconductor device, generally designated 10, is depicted schematically. Device 10, for purposes of example, is shown as a vertical-channel device fabricated by double-diffused metal-oxide-semiconductor (DMOS) technology. It will be appreciated, however, that other forms of the device may be fabricated, for example, by employing "V"-groove MOS (VMOS) technology. Further descriptions of DMOS and VMOS structures may be found in S. M. Sze, *Physics of Semiconductor Devices*, second edition, New York: John Wiley & Sons, Inc., (1981), pages 489-90 and 494-95; and in the above-identified U.S. Pat. Nos. 4,072,975 to Ishitani and 4,145,703 to Blanchard et al.

Device 10 includes, on the same semiconductor chip, an IGT portion 12, and a MOSFET portion 14, which may be more generically described as an IGFET portion. The particular geometry of device 10 of FIG. 1 is representative only, as a variety of different device geometries may be employed, such as various annular ring geometries and various interdigitated structures.

Structurally, device 10 comprises a body 16 of semiconductor material, such as silicon, having lower and upper principal surfaces 18 and 20 on opposite sides of the body. Between principal surfaces 18 and 20, device 10 includes separate IGT and MOSFET portions 12 and 14, respectively.

Body 16 includes a first base layer 22 of one conductivity type, for example, an N− base layer, common to both the IGT portion 12 and MOSFET portion 14. Body 16 additionally includes a first main terminal region 28 common to both the IGT portion 12 and MOSFET portion 14. The first main terminal region 28 is heavily doped to the opposite conductivity type (P+). Region 28 extends to the lower principal surface 18 in ohmic contact with anode/drain electrode metallization 30, which, in turn, comprises one of two device main terminals.

Within IGT portion 12, the P+ terminal region layer 28 is contiguous with the N− first base layer 22 at an interface 32, and a portion 34 of the terminal region layer 28 comprises an IGT collector. During forward conduction in the IGT portion 12 of the device, holes are injected from the P+ collector region portion 34 into the N— first base region 22. In a bipolar conduction mode, these holes recombine within the N— base region with electrons.

In order to avoid bipolar conduction in first base region 22 within MOSFET portion 14 of the device, the P+ first main terminal region 28 is not contiguous with the N— base 22 within portion 14. Rather, a heavily-doped buried layer 36 of the one conductivity type (N+) is included within portion 14 of body 16 between N— first base layer 22 and P+ terminal region 28. During device operation, N+ buried layer 36 prevents injection of holes from P+ electrode region 28 into N— first base layer 22 within MOSFET portion 14, thereby preventing accumulation of excess charge carriers in this portion of N— base layer 22 and preserving its character as a MOSFET N— drift region. This technique, as well as an alternative technique, are described in greater detail in the above-identified commonly-assigned Baliga application Ser. No. 464,161.

Since both the P+ terminal region 28 and N+ buried layer 36 are heavily doped, the junction as their interface 38 is essentially a tunnel junction across which conduction readily occurs by means of a tunneling mechanism as is well known in the art. The connection is, therefore, essentially ohmic.

Buried layer 36 can be formed by employing conventional techniques. For example, a typical fabrication process begins with P+ terminal region layer 28 as a substrate. Appropriate impurities, i.e. dopant atoms, are introduced through a suitable mask (not shown) to define the location of buried layer 36. Thereafter, the mask is removed and N— first base layer 22 is epitaxially grown over P+ substrate 28. Buried layer 36 extends slightly up into N— base layer 22 due to diffusion during vapor phase epitaxial grown and subsequent device processing.

Although not specifically illustrated herein, as an alternative to fabricating N+ buried layer 36 to avoid bipolar conduction in the MOSFET portion 14 of the device, substrate layer 28 may be divided into a P+ collector region 34 in IGT portion 12 of the device and an N+ drain region in MOSFET portion 14, employing a technique disclosed in greater detail in the above-identified commonly-assigned Baliga application Ser. No. 464,161. This will avoid bipolar conduction in MOSFET portion 14 of the device. Fabrication of this alternative device structure requires that diffused regions be formed at both the upper and lower principal surfaces of the device.

In overview, the remaining upper structure of device 10 comprises an IGT emitter and polysilicon gate upper structure, generally designated 40, a MOSFET upper structure generally designated 42, and a polysilicon resistance element, generally designated $R_G$, electrically interconnecting the IGT and MOSFET gates. In IGT upper structure 40 and MOSFET upper structure 42, cells (or repeated structure) 40' and 42' are typically repeated many times in the respective portions 12 and 14 of device 10, but are shown in reduced number for ease of description. IGT upper emitter structure 40 is substantially identical to MOSFET upper structure 42 such that the two structures 40 and 42 can be fabricated at the same time employing precisely the same fabrication techniques. In addition, the resistance element $R_G$ can be fabricated at the same time, inasmuch as resistance element $R_G$ is similar in structure to the polysilicon gate electrode.

More particularly, device 10 additionally includes a second base region 45 of the opposite conductivity type (P). In the geometry depicted, P base region 45 comprises portions 46 and 48, portion 46 being part of the IGT upper structure 40, and portion 48 being part of the MOSFET upper structure 42. P base portions 46 and 48 are contiguous with N— base layer 22. In the structure illustrated, portions 46 and 48 of P base region 45 comprise individual island-like P base regions respectively included in the IGT and MOSFET portions of the device, although it will be appreciated that other arrangements may be employed.

Included in device 10 and comprising respective portions of upper structures 40 and 42 in the second main terminal region are first and second portions 50 and 52 of the one conductivity type (N+), specifically, emitter region 50 and a heavily-doped N+ MOSFET source region 52. Also included within body 16 are first and second channel portions 54 and 56, which are regions within P base portions 46 and 48 where majority carriers (holes) may selectively be depleted and N conductivity type inversion regions formed as the device 10 is gated.

First channel portion 54 comprises the controllable conduction channel of an IGT and extends into P base portion 46 from second (upper) principal surface 20 of body 16. IGT emitter region 50 and N— base layer 22 are spaced from each other to define the extent of first channel portions 54 therebetween.

Second channel portions 56 are substantially identical to first channel portions 54, and comprise the controllable conduction channel of a MOSFET. Channel portions 56 extend into the P base portion 48 from second (upper) principal surface 20 of body 16. N+ source region 52 and N— base layer 22 are spaced to define the extent of second channel portion 56 therebetween.

Although in device 10 of FIGS. 1, second (upper) principal surface 20 of semiconductor body 16 is planar, it will be appreciated that variations are possible, such as in a VMOS form of the device.

IGT insulated-gate electrodes 70 of upper structure 40 are disposed over channel 54 and MOSFET insulated gate electrodes 72 of source and gate structure 42 are disposed over channel 56. Gate electrodes 70 and 72 are insulated from the semiconductor body 16 by respective underlying (and encasing) gate oxide layers 74 and 75 which may comprise, for example, silicon dioxide or silicon nitride. Gate electrodes 70 and 72 preferably comprise highly-doped polycrystalline silicon of either conductivity type, as is known in the art, and are configured for inducing, through an inversion process when gate voltage is applied thereto, N conductivity type conduction channels in the respective channel portions 54 or 56 extending between the respective N+ terminal region (N+ emitter 50 or N+ source 52) and N— base layer 22.

Polysilicon gate electrodes 70 and 72 may be connected through appropriate contact windows in the insulating layers to respective gate electrode terminals or conductive pads $G_1$ and $G_2$ (shown schematically). Preferably, however, only one of gate electrode terminals $G_1$ and $G_2$ is energized for operation, either gate electrode terminal $G_1$ in the IGT portion 12 of the device, or gate electrode terminal $G_2$ in MOSFET portion 14 of the device, due to the presence of resistance element $R_G$.

Preferably, resistance element $R_G$ comprises a bridge of polysilicon joining the polysilicon gate electrode structures 70 and 72. As will be appreciated by those skilled in the art, a gate electrode capacitance is associated with each of electrodes 70 and 72. For instance, a gate electrode capacitance (not shown) for gate electrode 70 is formed by the conductor-insulator-semiconductor structure comprising gate electrode 70, gate oxide layer 74 and N+ emitter region 50. These gate electrode capacitances, in combination with resistance $R_G$, comprise RC timing networks. These timing networks play an important part in operation of the invention, as described with reference to FIGS. 3-6.

To provide device 10 with a second terminal electrode, upper electrode metallization 80 is disposed over the encased polysilicon gate electrodes 70 and 72 in ohmic contact with N+ emitter regions 50 and N+ source regions 52. Metallization 80 preferably comprises a single layer of aluminum, appropriately patterned.

Consistent with conventional requirements for N+ cathode-to-P base shorts in IGTs and for N+ source-to-P base shorts in power MOSFETs, shorting extensions 82 and 84 of the second base regions 46 and 48, respectively, are provided and are in ohmic contact with the device emitter and source metallization 80. A common guard ring 88 of P+ conductivity type encircles both IGT portion 12 and MOSFET portion 14 at second principal surface 20 of the device.

Figure 2:
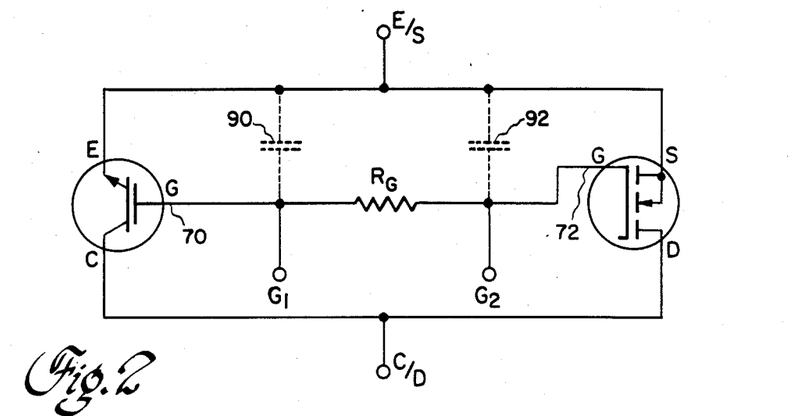
FIG. 2 is an equivalent electrical schematic circuit diagram of the device of FIG. 1, depicting alternative device gate connection terminals.

FIG. 2 is an equivalent electrical schematic diagram of the device 10 of FIG. 1. In FIG. 2, two device main terminals, a collector/drain terminal, designated C/D, and a emitter/source terminal designated E/S, are shown connected respectively to the device lower electrode metallization 18 and upper metallization 80. For purposes of illustration, two gate electrode terminals G1 and G2 are shown, although in practice only one of the terminals is actually energized, depending upon the desired characteristics of the overall device. Different device characteristics can be realized, depending upon whether terminal G1, connected relatively directly to IGT gate 70, or terminal G2, connected relatively directly to MOSFET gate 72, is energized.

As mentioned above, associated with each of gates 70 and 72 is a gate electrode capacitance, represented in phantom in FIG. 2 by capacitors 90 and 92. These capacitances cooperate with resistance $R_G$ to form RC timing networks. When gate terminal G1, connected relatively directly to IGT gate electrode 70, is energized, the gate signal to MOSFET gate electrode 72 is delayed by the RC time delay action of resistance $R_G$ and capacitance 92. Conversely, when gate electrode terminal G2, connected relatively directly to MOSFET gate electrode 72, is employed as a device gate terminal, the gate signal to IGT gate electrode 70 is delayed with respect to the MOSFET gate signal. For purposes of example only, a representative value for gate capacitances 90 and 92 is 1000 pf, and a representative value for resistance $R_G$ is 5000 ohms.

Figure 3:
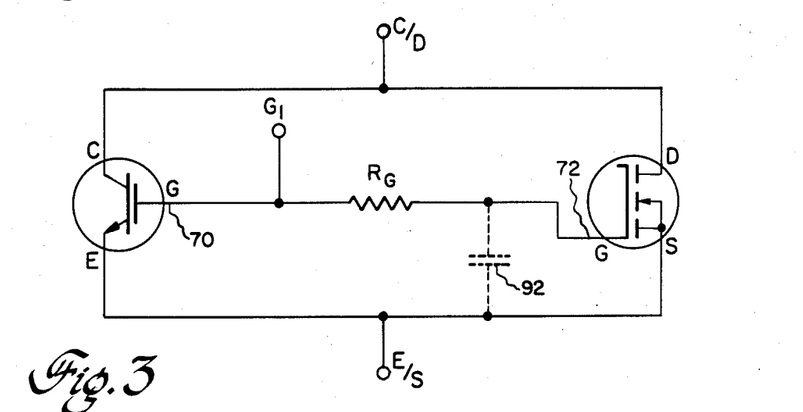
FIG. 3 is an equivalent electrical schematic circuit diagram comparable to FIG. 2, but of an integrated power switching device wherein the device gate terminal is connected relatively nearer the IGT gate.

FIG. 3 is an equivalent electrical schematic circuit diagram for the particular case where only gate G1, connected relatively directly to the IGT gate electrode 70, is employed. Resistance $R_G$ is then in series with gate 72 of the MOSFET. The resultant device exhibits low steady-state and switching losses, and is particularly adapted for use in motor drive circuitry.

Figure 4:
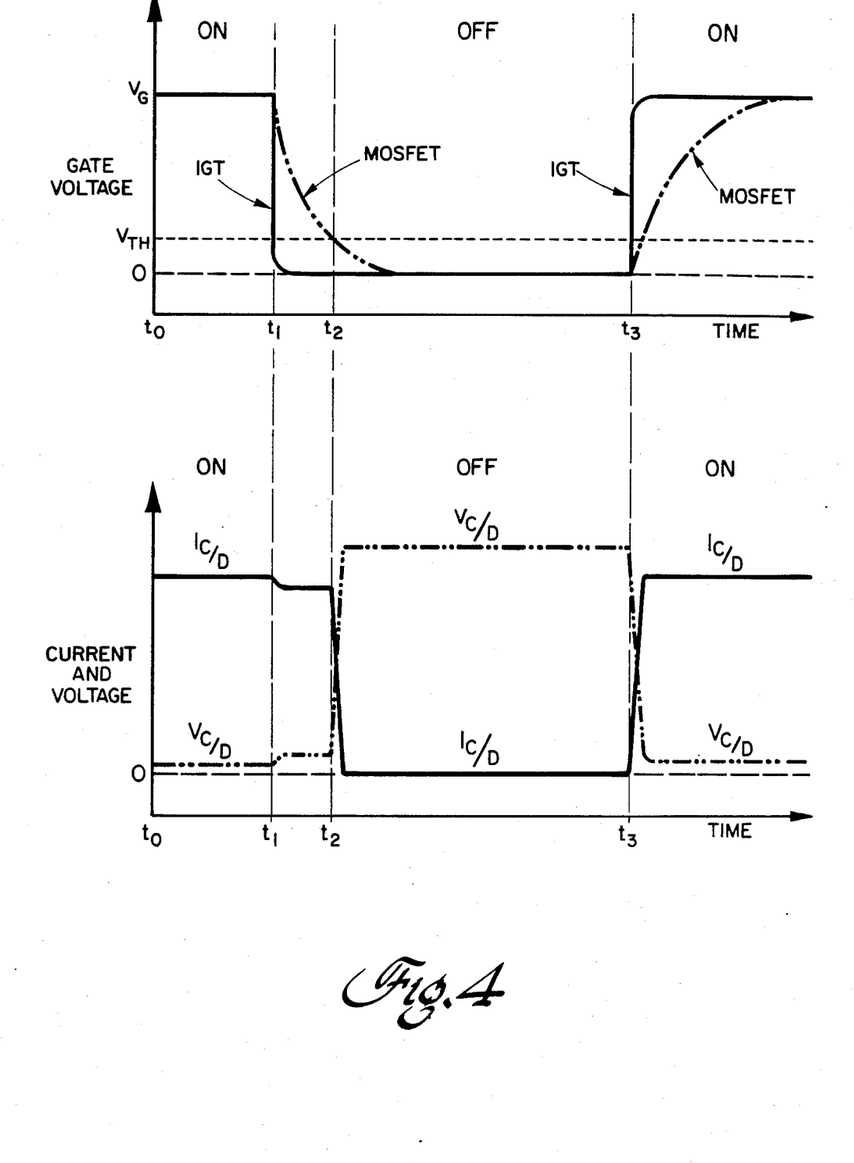
FIG. 4 is a plot as a function of time of ON and OFF switching waveforms illustrating operation of the circuit of FIG. 3 when the integrated power switching semiconductor device gate terminal is connected relatively nearer the IGT gate.

FIG. 4 depicts switching waveforms for the circuit of FIG. 3. Only a single, low-voltage, low-current MOS gate drive signal is required for this device. In the upper plot of gate voltage as a function of time, IGT gate voltage is seen to change substantially instantaneously with the gate drive signal applied at times $t_1$ and $t_2$, and rapidly crosses the switching threshold voltage $V_{TH}$, while the voltage on MOSFET gate electrode 72 changes relatively slowly due to the RC time constant.

In FIG. 4, at time $t_0$ the device is assumed to be initially ON with a gate signal applied. Thereafter, at time $t_1$ the gate voltage is brought to zero (the potential of the cathode/source terminal E/S). The IGT structure 12 (FIG. 1) immediately ceases conducting (relative to the low frequency employed), while MOSFET 14 (FIG. 1) continues to conduct, at least partially, until time $t_2$, when its gate bias falls below threshold voltage $V_{TH}$. During the time interval $(t_2-t_1)$, IGT "current tailing" during turn-off is advantageously allowed to occur, during which the MOSFET shunts current and the IGT incurs very low switching losses. During the time interval $(t_2-t_1)$, voltage across overall device 10 remains low because the MOSFET is still ON. Thereafter, when the MOSFET turns OFF at time $t_2$, relatively low switching losses are involved.

During turn-on of this device, at time $t_3$, the IGT quickly turns on, followed by the MOSFET. Since the IGT can inherently handle high di/dt and fast turn-on, the turn-on switching losses are also low. Moreover, steady state conduction losses are quite low since the IGT conducts at high current densities with low forward voltage drop, being capable of supporting in the order of five times the current density of a bipolar junction transistor and twenty times that of the MOSFET.

Figure 5:
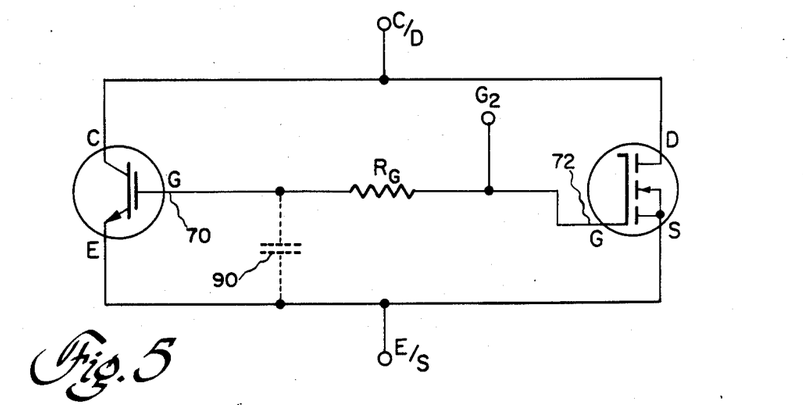
FIG. 5 is an equivalent electrical schematic circuit diagram comparable to FIG. 2 but of an integrated power switching device wherein the device gate terminal is connected relatively nearer the IGFET gate.

FIG. 5 shows an equivalent electrical schematic circuit diagram for the case where the gate terminal G2 relatively nearer the MOSFET is employed. This results in a switching device exhibiting relatively low power losses during low frequency switching, and yet being capable of high speed switching at high frequencies. This is important in certain circuits where a power switching device must work efficiently at both low frequencies (such as 120 Hz) and at high frequencies (such as 100 kHz and where two separate devices have traditionally been employed in the past.

Figure 6:
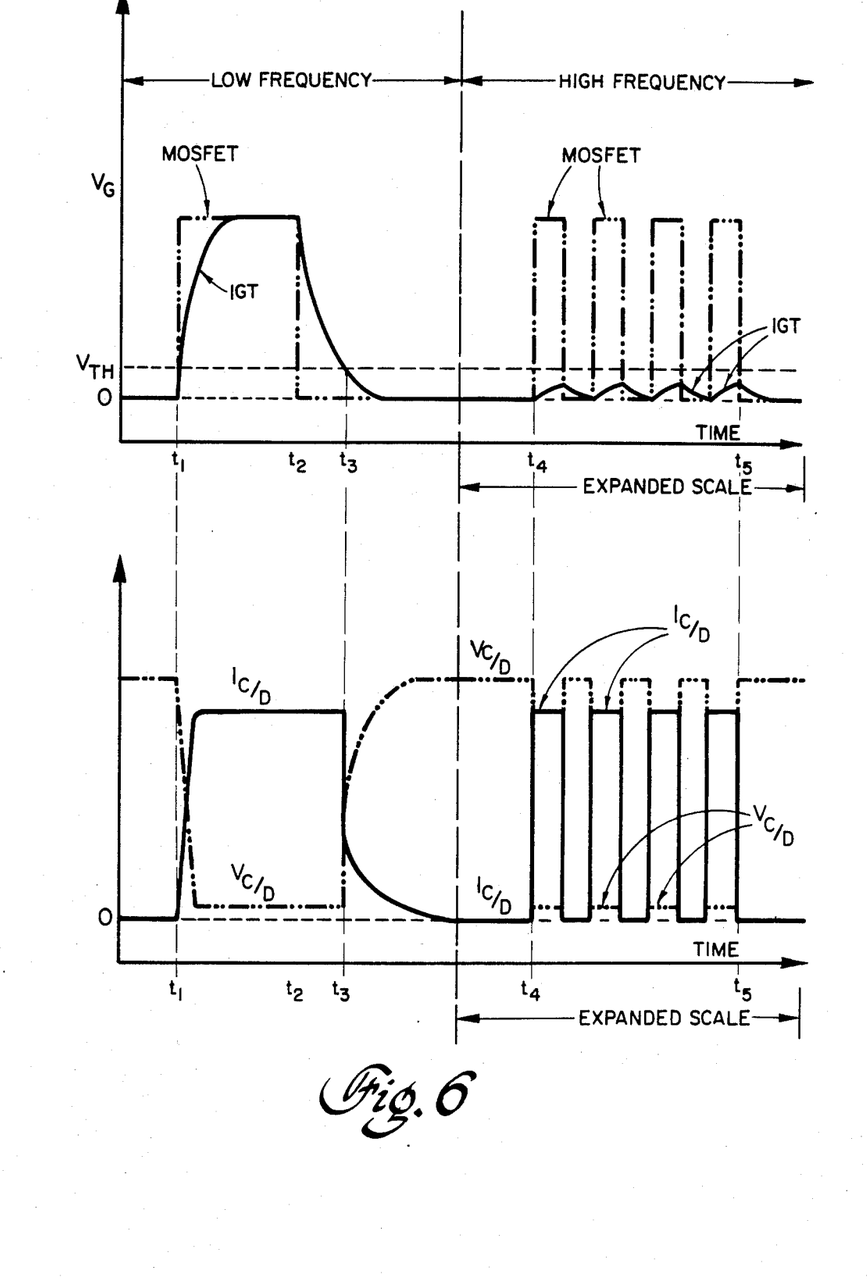
FIG. 6 is a plot as a function of time of ON and OFF switching waveforms for both low and high frequencies illustrating operation of the circuit of FIG. 5 when the integrated power switching semiconductor device terminal is connected relatively near the IGFET gate.

FIG. 6 depicts switching waveforms for the structure in FIG. 5 at low and high frequencies. In this structure, the gate voltage is applied directly to the MOSFET gate 72 and through the gate resistance $R_G$ to the IGT gate 70. At low frequencies, there is sufficient time for the IGT gate voltage to increase in value to above its threshold voltage $V_{TH}$. Both the MOSFET and IGT are, therefore, active in this mode of operation. Thus, at low frequencies, the IGT provides low steady state power loss during the time interval $(t_2-t_1)$. However, because the IGT is active, it turns off slowly with the current tailing indicated at time $t_3$. This does not allow high frequency switching of IGTs in the circuit shown in FIG. 5, the RC time constant for charging the IGT gate capacitance is large so as to prevent the IGT gate voltage from rising above its threshold voltage $V_{TH}$. This is indicated in FIG. 6 during time interval $(t_5-t_4)$. Accordingly, during high frequency operation, the IGT is non-conducting while the MOSFET performs the required high frequency power switching in response to the gate signals.

The foregoing describes a combination three-terminal semiconductor power switching device including a single gate drive terminal. The device exhibits low steady state losses and low switching losses when operated at relatively low switching frequencies and yet is capable of relatively high speed switching. The device comprises two different semiconductor device structures which may readily be fabricated simultaneously.

While specific embodiments of the invention have been illustrated and described herein, it is realized that numerous modifications and changes will occur to those skilled in the art. It is therefore to be understood that the appended claims are intended to cover all such modifications and changes as fall within the true spirit and scope of the invention.

What is claimed is:

1. An integrated power switching semiconductor device comprising:
    a body of semiconductor material including an insulated-gate transistor portion and an insulated-gate field-effect transistor portion, said body having first and second opposed principal surfaces on opposite sides thereof;
    a first base layer of one conductivity type common to both said insulated-gate transistor portion and said insulated-gate field-effect transistor portion;
    a first main terminal region adjacent said first base layer and extending to said first principal surface, said first main terminal region including at least a portion heavily-doped to a conductivity type opposite to the conductivity type of said one conductivity and defining a PN junction with said first base layer within said insulated gate transistor portion, and said first base layer and said first main terminal region including structure for avoiding bipolar conduction within said insulated-gate field-effect transistor portion;
    a second base region of the opposite conductivity type and having two portions contiguous with said first base layer, one of said portions of said second base region being included in said insulated gate transistor portion and the other of said portions of said second base region being included in said insulated-gate field-effect transistor portion;
    a first region of the one conductivity type being included in said insulated-gate transistor portion contiguous with said one portion of said second base region;
    a second region of the one conductivity type included in said insulated-gate field-effect transistor portion contiguous with said other portion of said second base region;
    a second terminal overlying at least a portion of said second base region and said first region and being in contact therewith;
    a first channel region included in said insulated-gate transistor portion within said first region of the one conductivity type, and a second channel region included in said insulated-gate fieldeffect transistor portion within said second region of the one conductivity type, said first and second regions of the one conductivity type being spaced from the respective portions of said first base layer to define the extent of the respective channel regions therebetween;
    first and second gate electrodes respectively disposed over said first and second channel regions and insulatingly spaced therefrom, said gate electrodes configured for inducing, when gate voltage is applied thereto, respective conduction paths of the one conductivity type in the respective channel regions beneath the respective energized gate electrodes;
    a resistance element connected between said first and second gate electrodes; and
    a device gate conductor connected directly to one of said gate electrodes and to the other of said gate electrodes by said resistive element.

2. A power switching semiconductor device in accordance with claim 1, wherein said device gate conductor is connected to said first gate electrode to provide the device with relatively low steady state and switching losses.

3. A power switching semiconductor device in accordance with claim 1, wherein said device gate conductor is connected to said second gate electrode to provide the device with a relatively low power loss during low frequency switching operation and the capability of relatively high speed switching.

4. A power switching semiconductor device in accordance with claim 1, wherein said gate electrodes comprise polysilicon, and wherein said resistance element comprises a bridge of polysilicon joining said polysilicon gate electrodes.

5. A power switching semiconductor device in accordance with claim 4, wherein said polysilicon gate electrodes and said bridge are coplanar.

6. A power switching semiconductor device in accordance with claim 1, wherein said structure for avoiding bipolar conduction within said insulated-gate field-effect transistor portion comprises a buried layer heavily doped to the one conductivity type between said first base layer and said first main terminal region only in said field-effect transistor portion.

* * * * *